United States Patent
Akram et al.

(10) Patent No.: US 10,446,440 B2
(45) Date of Patent: *Oct. 15, 2019

(54) SEMICONDUCTOR DEVICES COMPRISING NICKEL— AND COPPER—CONTAINING INTERCONNECTS

(71) Applicant: Micron Technology, Inc., Boise, ID (US)

(72) Inventors: Salman Akram, Boise, ID (US); James M. Wark, Boise, ID (US); William Mark Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 27 days.

This patent is subject to a terminal disclaimer.

(21) Appl. No.: 16/106,611

(22) Filed: Aug. 21, 2018

(65) Prior Publication Data

US 2018/0358263 A1    Dec. 13, 2018

Related U.S. Application Data

(63) Continuation of application No. 15/584,226, filed on May 2, 2017, now Pat. No. 10,062,608, which is a
(Continued)

(51) Int. Cl.
*H01L 21/768* (2006.01)
*C23C 18/18* (2006.01)
(Continued)

(52) U.S. Cl.
CPC .... *H01L 21/76879* (2013.01); *C23C 18/1607* (2013.01); *C23C 18/1637* (2013.01);
(Continued)

(58) Field of Classification Search
None
See application file for complete search history.

(56) References Cited

U.S. PATENT DOCUMENTS 3,726,771 A    4/1973 Coll
4,017,265 A    4/1977 Taylor
(Continued)

FOREIGN PATENT DOCUMENTS

EP    0455915 A1    11/1991
WO    03/19651    3/2003

OTHER PUBLICATIONS

Law et al., The Effect of Passivation Defect on Electroless Nickel Under Bump Metallization Plating Process, www.ee.vst.hk/.about.flipchip/ctu.sub.-simon.doc.
(Continued)

*Primary Examiner* — Zandra V Smith
*Assistant Examiner* — Lawrence C Tynes, Jr.
(74) *Attorney, Agent, or Firm* — TraskBritt

(57) ABSTRACT

A method of activating a metal structure on an intermediate semiconductor device structure toward metal plating. The method comprises providing an intermediate semiconductor device structure comprising at least one first metal structure and at least one second metal structure on a semiconductor substrate. The at least one first metal structure comprises at least one aluminum structure, at least one copper structure, or at least one structure comprising a mixture of aluminum and copper and the at least one second metal structure comprises at least one tungsten structure. One of the at least one first metal structure and the at least one second metal structure is activated toward metal plating without activating the other of the at least one first metal structure and the at least one second metal structure. An intermediate semiconductor device structure is also disclosed.

20 Claims, 3 Drawing Sheets

Related U.S. Application Data continuation of application No. 14/176,547, filed on Feb. 10, 2014, now Pat. No. 9,640,433, which is a continuation of application No. 12/401,566, filed on Mar. 10, 2009, now Pat. No. 8,647,982, which is a continuation of application No. 11/516,193, filed on Sep. 6, 2006, now abandoned, which is a continuation of application No. 10/934,635, filed on Sep. 2, 2004, now Pat. No. 7,279,407.

(51) Int. Cl.

| | | |
|---|---|---|
| *C23C 18/16* | (2006.01) | |
| *H01L 21/288* | (2006.01) | |
| *C23C 18/34* | (2006.01) | |
| *C23C 18/36* | (2006.01) | |

(52) U.S. Cl.
CPC ...... *C23C 18/1831* (2013.01); *C23C 18/1834* (2013.01); *H01L 21/288* (2013.01); *H01L 21/76898* (2013.01); *C23C 18/34* (2013.01); *C23C 18/36* (2013.01); *H01L 2924/00013* (2013.01); *Y10T 428/12528* (2015.01); *Y10T 428/24917* (2015.01)

(56) References Cited

U.S. PATENT DOCUMENTS

| | | | |
|---|---|---|---|
| 4,104,111 A | 8/1978 | MacK | |
| 4,125,648 A | 11/1978 | Vratny | |
| 5,079,040 A | 1/1992 | Brandenburger | |
| 5,147,692 A | 9/1992 | Bengston | |
| 5,169,680 A | 12/1992 | Ting et al. | |
| 5,580,668 A | 12/1996 | Kellam | |
| 5,608,264 A | 3/1997 | Gaul | |
| 5,618,752 A | 4/1997 | Gaul | |
| 5,646,067 A | 7/1997 | Gaul | |
| 5,682,062 A * | 10/1997 | Gaul | H01L 23/481 257/686 |
| 5,795,619 A | 8/1998 | Lin et al. | |
| 5,814,889 A | 9/1998 | Gaul | |
| 6,028,011 A | 2/2000 | Takase et al. | |
| 6,083,834 A | 7/2000 | Chang et al. | |
| 6,197,688 B1 * | 3/2001 | Simpson | H01L 21/2885 438/678 |
| 6,261,367 B1 | 7/2001 | Donges | |
| 6,300,678 B1 | 10/2001 | Suehiro et al. | |
| 6,346,148 B1 | 2/2002 | Rantanen | |
| 6,407,570 B1 | 6/2002 | Farnworth et al. | |
| 6,452,274 B1 | 9/2002 | Hasegawa et al. | |
| 6,458,696 B1 | 10/2002 | Gross | |
| 6,479,902 B1 | 11/2002 | Lopatin et al. | |
| 6,503,343 B1 | 1/2003 | Tench et al. | |
| 6,566,253 B2 | 5/2003 | Jiang | |
| 6,593,221 B1 | 7/2003 | Lindgren | |
| 6,593,224 B1 * | 7/2003 | Lin | H05K 3/205 438/618 |
| 6,620,731 B1 | 9/2003 | Farnworth et al. | |
| 6,673,710 B1 | 1/2004 | Lin | |
| 6,740,582 B2 | 5/2004 | Siniaguine | |
| 6,759,751 B2 | 7/2004 | Sinha | |
| 6,849,519 B2 | 2/2005 | Dong | |
| 6,873,054 B2 | 3/2005 | Miyazawa et al. | |
| 6,974,776 B2 | 12/2005 | Dean et al. | |
| 7,279,407 B2 | 10/2007 | Akram et al. | |
| 7,619,309 B2 * | 11/2009 | Drexl | H01L 23/53228 257/758 |
| 10,062,608 B2 * | 8/2018 | Akram | H01L 21/288 |
| 2001/0002317 A1 | 5/2001 | Agarwal et al. | |
| 2001/0036746 A1 | 11/2001 | Sato et al. | |
| 2002/0043466 A1 | 4/2002 | Dordi et al. | |
| 2002/0047210 A1 | 4/2002 | Yamada et al. | |
| 2002/0190371 A1 | 12/2002 | Mashing et al. | |
| 2003/0038369 A1 | 2/2003 | Layadi et al. | |
| 2003/0080408 A1 | 5/2003 | Farnworth et al. | |
| 2003/0155408 A1 * | 8/2003 | Fanti | H01L 21/2885 228/215 |
| 2003/0207470 A1 | 11/2003 | Azuma et al. | |
| 2004/0016942 A1 | 1/2004 | Miyazawa et al. | |
| 2004/0108136 A1 * | 6/2004 | Andricacos | C25D 3/562 174/262 |
| 2004/0149689 A1 | 8/2004 | Ning et al. | |
| 2004/0161926 A1 | 8/2004 | Yamaguchi | |
| 2005/0014359 A1 | 1/2005 | Segawa et al. | |
| 2005/0074968 A1 * | 4/2005 | Chen | H01L 21/2855 438/643 |
| 2005/0082676 A1 * | 4/2005 | Andry | H01L 21/76898 257/763 |
| 2005/0104228 A1 | 5/2005 | Rigg et al. | |
| 2005/0127478 A1 * | 6/2005 | Hiatt | H01L 21/6835 257/621 |
| 2005/0133930 A1 * | 6/2005 | Savastisuk | H01L 23/147 257/774 |
| 2005/0136635 A1 | 6/2005 | Savastiouk et al. | |
| 2005/0146049 A1 | 7/2005 | Kripesh et al. | |
| 2005/0150683 A1 | 7/2005 | Farnworth et al. | |
| 2005/0151228 A1 | 7/2005 | Tanida et al. | |
| 2005/0186790 A1 | 8/2005 | Kirby et al. | |
| 2005/0275049 A1 | 12/2005 | Kirby et al. | |
| 2005/0287783 A1 * | 12/2005 | Kirby | H01L 21/76898 438/597 |
| 2006/0046088 A1 * | 3/2006 | Akram | H01L 21/288 428/620 |
| 2007/0004200 A1 | 1/2007 | Akram et al. | |
| 2007/0132105 A1 | 6/2007 | Akram et al. | |
| 2009/0176362 A1 | 7/2009 | Akram et al. | |
| 2014/0086899 A1 * | 3/2014 | Howells | G01N 33/6893 424/94.64 |
| 2014/0154879 A1 | 6/2014 | Akram et al. | |

OTHER PUBLICATIONS

International Written Opinion for International Application No. PCT/US2005/030228 dated Jul. 12, 2007, 10 pages.
International Search Report for International Application No. PCT/US2005/030228, dated Jul. 12, 2007 (6 pages).
International Preliminary Report on Patentability for International Application No. PCT/US2005/030228 dated Jul. 31, 2007, 11 pages.
European Examination Report from European Application No. 05791783.3, dated Feb. 28, 2018, 5 pages.

* cited by examiner

SEMICONDUCTOR DEVICES COMPRISING NICKEL— AND COPPER—CONTAINING INTERCONNECTS

CROSS-REFERENCE TO RELATED APPLICATIONS

This application is a continuation of U.S. patent application Ser. No. 15/584,226, filed May 2, 2017, now U.S. Pat. No. 10,062,608, issue Aug. 28, 2018 which is a continuation of U.S. patent application Ser. No. 14/176,547, filed Feb. 10, 2014, now U.S. Pat. No. 9,640,433, issued May 2, 2017, which is a continuation of U.S. patent application Ser. No. 12/401,566, filed Mar. 10, 2009, now U.S. Pat. No. 8,647,982, issued Feb. 11, 2014, which is a continuation of U.S. patent application Ser. No. 11/516,193, filed Sep. 6, 2006, now abandoned, which is a continuation of U.S. patent application Ser. No. 10/934,635, filed Sep. 2, 2004, now U.S. Pat. No. 7,279,407, issued Oct. 9, 2007, and is also related to U.S. patent application Ser. No. 11/702,286, filed Feb. 5, 2007, now U.S. Pat. No. 7,855,454, issued Dec. 21, 2010. The disclosure of each of the previously referenced U.S. patents and patent applications is hereby incorporated by reference in its entirety.

TECHNICAL FIELD

Field of the Invention

The present invention relates to semiconductor fabrication. More specifically, the present invention relates to a method of selectively plating aluminum, copper, or tungsten structures with nickel.

BACKGROUND

Semiconductor devices that have integrated circuits are produced by fabricating a large plurality of identical circuit patterns on a semiconductor wafer using photolithography in combination with various other processes. It is a continual goal of semiconductor manufacturers to increase the density of semiconductor devices fabricated on a given size of semiconductor substrate to achieve increased yield of semiconductor devices and enhanced performance thereof. In recent years, efforts to increase the density of semiconductor devices in a semiconductor assembly have also intensified. One way to increase the density of semiconductor devices in a semiconductor assembly is to stack semiconductor dies upon one another. The semiconductor dies are interconnected by forming vias or through holes in the semiconductor dies. The vias are filled with an electrically conductive material to electrically connect the vias to integrated circuitry fabricated on an active surface of the semiconductor die. Thus, the vias provide a conductive pathway from the active surface of the semiconductor die to its respective back surface, enabling interconnection of the back surface of the semiconductor die to external electrical contacts of another semiconductor die or a carrier substrate. The vias are formed by etching, laser ablation or drilling, or a combination thereof. Etching the vias utilizes photolithographic processing of a photoresist followed by wet (chemical) or dry (reactive ion) etching. Laser drilling has been used to form vias by ablating semiconductor material to form through holes extending through the entire thickness of a semiconductor die.

The vias electrically interconnect various metal interconnection structures on the semiconductor die, such as annular rings, bond pads, component leads, metal wires, or other metal layers, to one another. Bond pads on the semiconductor dies are typically formed from aluminum, copper, or aluminum-copper alloys having less than about 0.5% copper. Aluminum is used in bond pads because of its low resistivity, superior adhesion qualities, high thermal stability, and ease of workability. However, one disadvantage of aluminum is that it readily oxidizes to form aluminum oxides, which decrease quality of the electrical connection and the efficiency of the bond pads. To protect the bond pads, the aluminum is etched to remove the aluminum oxides and covered with a barrier metal, such as a nickel layer. Tungsten is also commonly used as an interconnection material because it has a thermal expansion coefficient that is similar to that of silicon and has a good filling capability in semiconductor structures with high aspect ratios. Tungsten is typically used to fill or line a surface of an opening produced during formation of a via. The tungsten lining in the via is subsequently covered with a metal layer, such as a nickel layer. The bond pads are typically nickel plated after vias have been plated with nickel because etchants used to remove the aluminum oxides also remove nickel plating from inside the vias.

BRIEF SUMMARY

The present invention relates to a method of selectively plating nickel on an intermediate semiconductor device structure. The method comprises providing an intermediate semiconductor device structure comprising at least one aluminum or copper structure and at least one tungsten structure on a semiconductor substrate. One of the at least one aluminum or copper structure and the at least one tungsten structure is nickel plated while the other of the at least one aluminum or copper structure and the at least one tungsten structure remains unplated. The nickel may be plated electrolessly. The at least one aluminum or copper structure may be at least one aluminum or copper bond pad and the at least one tungsten structure may be at least one via having a layer of tungsten therewithin. In one embodiment, the at least one aluminum or copper bond pad may be nickel plated while the at least one via having a layer of tungsten therewithin remains unplated. In another embodiment, the at least one via having a layer of tungsten therewithin may be plated with nickel while the at least one aluminum or copper bond pad remains unplated.

One of the at least one aluminum or copper structure and the at least one tungsten structure may be plated while the other remains unplated by selecting a nickel plating chemistry selective for one of aluminum, copper, and tungsten. To nickel plate one of the at least one aluminum or copper structure and the at least one tungsten structure while the other remains unplated, one of the at least one aluminum or copper structure and the at least one tungsten structure may be activated toward nickel plating. The at least one aluminum or copper structure may be activated by exposing the intermediate semiconductor device structure to a zincate solution. The zincate solution may be an aqueous solution comprising zinc oxide and sodium hydroxide. The at least one tungsten structure may be activated toward nickel plating by exposing the intermediate semiconductor device structure to a palladium solution. The palladium solution may be an aqueous solution comprising palladium (II) ions.

The activated one of the at least one aluminum or copper structure and the at least one tungsten structure may be nickel plated by immersing the intermediate semiconductor device structure in an electroless nickel plating solution that comprises a nickel salt selected from the group consisting of nickel sulfate, nickel chloride, nickel sulfate, nickel bromide, nickel fluoroborate, nickel sulfonate, nickel sulfamate, and nickel alkyl sulfonate and a reducing agent selected from the group consisting of sodium hypophosphite, dimethylamine borane, sodium borohydride, and dimethylaminobenz-aldehyde ("DMAB"). The unplated one of the at least one aluminum or copper structure and the at least one tungsten structure may subsequently be nickel plated by activating the unplated structure and then nickel plating the activated structure.

The present invention also relates to an intermediate semiconductor device structure that comprises a semiconductor substrate comprising at least one aluminum or copper structure and at least one tungsten structure. One of the at least one aluminum or copper structure and the at least one tungsten structure is plated with nickel while the other of the at least one aluminum or copper structure and the at least one tungsten structure remains unplated. The at least one aluminum or copper structure may be at least one aluminum or copper bond pad and the at least one tungsten structure may be at least one via having a layer of tungsten therewithin. The at least one via having a layer of tungsten therewithin may be a through-wafer-interconnect or a blind-wafer-interconnect.

The present invention also relates to an intermediate semiconductor device structure that comprises a semiconductor substrate comprising at least one aluminum or copper structure having a first nickel layer plated thereon and at least one tungsten structure having a second nickel layer plated thereon. At least one of the first nickel layer and the second nickel layer is formed by formulating a nickel plating chemistry selective for one of the at least one aluminum or copper structure and the at least one tungsten structure. The at least one aluminum or copper structure may be at least one aluminum or copper bond pad and the at least one tungsten structure may be at least one via having a layer of tungsten therewithin. The at least one via having a layer of tungsten therewithin may be a through-wafer-interconnect or a blind-wafer-interconnect.

The nickel plating chemistry selective for the at least one aluminum or copper structure may include an aluminum or copper activator and an electroless nickel plating solution. The aluminum or copper activator may be a zincate solution, as previously described, and the electroless nickel plating solution may be as previously described. The nickel plating chemistry selective for the at least one tungsten structure may include a tungsten activator and an electroless nickel plating solution. The tungsten activator may be a palladium solution, as previously described, and the electroless nickel plating solution may be as previously described.

The present invention also relates to a method of plating nickel on an intermediate semiconductor device structure. The method comprises providing an intermediate semiconductor device structure comprising at least one aluminum or copper structure and at least one tungsten structure on a semiconductor substrate. The at least one aluminum or copper structure and the at least one tungsten structure are simultaneously plated with nickel. The at least one aluminum or copper structure and the at least one tungsten structure may be nickel plated by activating a surface of the at least one aluminum or copper structure and the at least one tungsten structure. To activate the surface of the at least one aluminum or copper structure, the intermediate semiconductor device structure may be exposed to a zincate solution, as previously described. To activate the surface of the at least one tungsten structure, the intermediate semiconductor device structure may be exposed to a palladium solution, as previously described. The activated, at least one aluminum or copper structure and the activated, at least one tungsten structure are simultaneously plated with nickel by immersing the intermediate semiconductor device structure in an electroless nickel plating solution, as described above.

BRIEF DESCRIPTION OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION

A method of selectively plating nickel on either an aluminum structure or a tungsten structure present on a semiconductor substrate is disclosed. The semiconductor substrate includes both the aluminum structure and the tungsten structure. In one embodiment, the aluminum structure is plated with nickel without depositing nickel on the tungsten structure. The aluminum structure is nickel plated with a nickel plating chemistry that is selective for aluminum. As used herein, the term "nickel plating chemistry" includes chemistries that are used to clean the structures, activate the structures, or plate the structures with nickel. In another embodiment, the tungsten structure may be plated with nickel without nickel plating the aluminum structure utilizing a nickel plating chemistry that is selective for tungsten. In another embodiment, the tungsten structure and the aluminum structure may be substantially simultaneously plated with nickel.

The nickel may be deposited on either the aluminum structure or the tungsten structure by electroless plating. To deposit the nickel, either the aluminum structure or the tungsten structure may be activated toward nickel plating by exposing the structures to an activator that is selective for either aluminum or tungsten. For instance, if the aluminum structure is to be nickel plated, the activator may be selective for aluminum. Conversely, if the tungsten structure is to be nickel plated, the activator may be selective for tungsten. A surface of the activated structure may then be plated with nickel while a surface of the unactivated structure remains unplated. The unplated surface may subsequently be plated with nickel by exposing the structures to a different nickel plating chemistry, such as a different activator, that is selective for the unplated surface. Once activated, the unplated surface may be nickel plated.

By exposing the structures to the activator selective for aluminum or tungsten, the aluminum structure or the tungsten structure may be activated and plated with nickel while the unactivated structure remains unplated. For instance, if the structures are exposed to an activator that is selective for aluminum, nickel may be electrolessly plated on the aluminum structure without nickel plating the tungsten structure.

After nickel plating the aluminum structure, nickel may be plated on the tungsten structure using a different nickel plating chemistry. Similarly, if the structures are exposed to an activator that is selective for tungsten, nickel may be electrolessly plated on the tungsten structure without plating the aluminum structure. Nickel may subsequently be plated on the aluminum structure using a different nickel plating chemistry.

While the embodiments disclosed herein describe that the aluminum structure is an aluminum bond pad and the tungsten structure is a tungsten-lined via, the present invention may also be used to selectively plate nickel on additional aluminum or tungsten structures.

Figure 1:
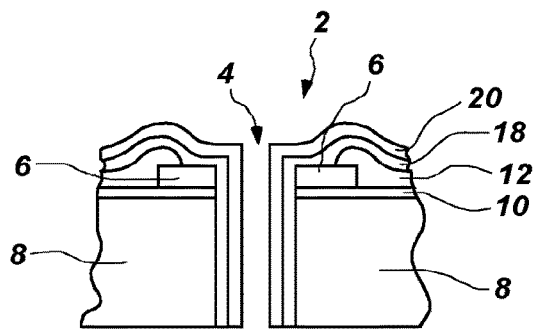
FIGS. 1, 3-8, 10, 12, 14, and 16 schematically illustrate a cross sectional view of one embodiment of an integrated circuit in which a through-wafer-interconnect is formed.
Figure 2:
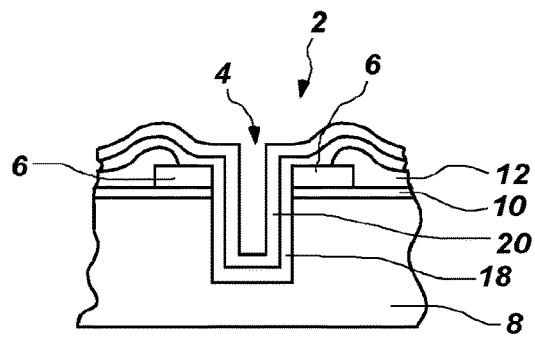
FIGS. 2, 9, 11, 13, and 15 schematically illustrate a cross sectional view of an embodiment of an integrated circuit in which a blind-wafer-interconnect is formed.

The nickel may be selectively plated on an intermediate semiconductor device structure 2 that has at least one aluminum structure and at least one tungsten structure. The tungsten structure may be a via 4 lined with tungsten and the aluminum structure may be a bond pad 6, as shown in FIGS. 1 and 2. As used herein, the term "via" refers to an opening in a semiconductor substrate 8 that is subsequently filled or lined with a conductive material to provide a conductive pathway through the semiconductor substrate 8. For the sake of clarity, one via 4 and two bond pads 6 are shown in FIGS. 1 and 2. However, the intermediate semiconductor device structure 2 may include a plurality of vias 4 and a plurality of bond pads 6. The via 4 and the bond pads 6 may both be present on an exterior or exposed surface of the intermediate semiconductor device structure 2 and, as such, may both be exposed. The bond pad 6 may be formed on the semiconductor substrate 8 from a conductive metal, such as aluminum, by conventional techniques. The bond pad 6 may have a thickness ranging from approximately 1.0 µm to approximately 1.5 µm. The via 4 may be filled or lined with the conductive material to provide the conductive pathway. The via 4 may extend through an entire thickness of the semiconductor substrate 8, as shown in FIG. 1, or may form a blind hole in the semiconductor substrate 8, as shown in FIG. 2. If the via 4 extends through the thickness of the semiconductor substrate 8, the via 4 may be referred to as a through-wafer-interconnect ("TWI"). The TWI may electrically connect integrated circuits on one side of the semiconductor substrate to another component or apparatus on the opposing side. If the via 4 forms a blind hole in the semiconductor substrate, the via 4 may be referred to as a blind-wafer-interconnect ("BWI").

Figure 3:
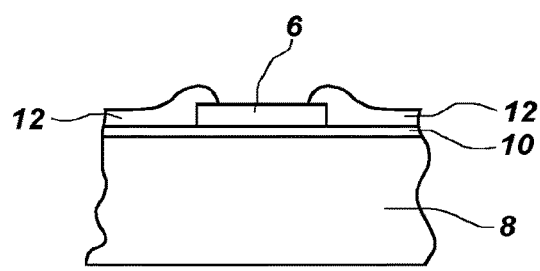

The intermediate semiconductor device structure 2 may also include a semiconductor substrate 8, a first oxide layer 10 covering a surface of the semiconductor substrate 8, and a passivation layer 12 covering portions of the first oxide layer 10, as shown in FIG. 3. The semiconductor substrate 8 may be a semiconductor wafer or other bulk substrate that includes a layer of semiconductive material. The term "bulk substrate" as used herein includes not only silicon wafers (e.g. monocrystalline silicon or polycrystalline silicon), but silicon on insulator ("SOI") substrates, silicon on sapphire ("SOS") substrates, silicon on glass ("SOG") substrates, epitaxial layers of silicon on a base semiconductor foundation, and other semiconductor materials, such as silicon-germanium, germanium, ruby, quartz, sapphire, gallium arsenide, diamond, silicon carbide, or indium phosphide. The first oxide layer 10 may be a silicon oxide layer, such as a layer of phosphorus silicate glass ("PSG"), borosilicate glass ("BSG"), borophosphosilicate glass ("BPSG"), or spin-on dielectric ("SOD"). In one embodiment, the first oxide layer 10 is a BPSG layer. The passivation layer 12 may be formed from silicon dioxide ("$SiO_2$"), silicon nitride ("SiN"), silicon oxynitride, BPSG, PSG, BSG, a polyimide, benzocyclobutene, mixtures thereof, or another nonconductive material as known in the art. In one embodiment, the passivation layer 12 is a sandwich structure of $SiO_2$ and SiN, as known in the art. The passivation layer 12 may have a thickness ranging from approximately 0.5 µm to 10 µm. The first oxide layer 10 and the passivation layer 12 may have been previously formed on the semiconductor substrate 8 by conventional techniques.

Figure 4:
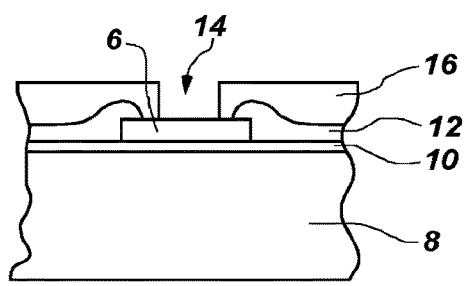
Figure 5:
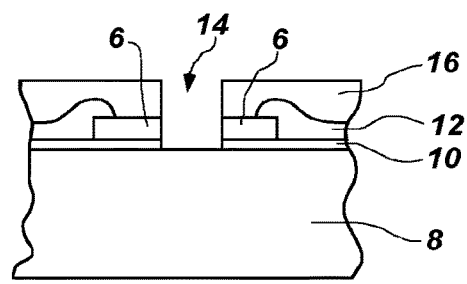
Figure 6:
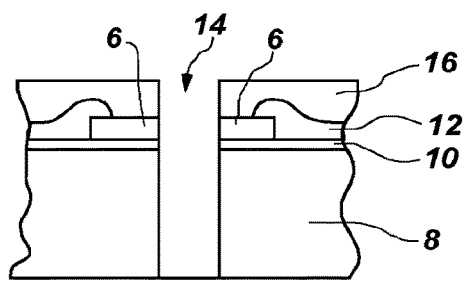
Figure 7:
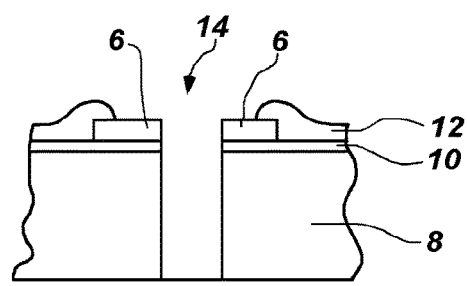

If the via 4 is to be a TWI, the via 4 may be formed in the intermediate semiconductor device structure 2 by forming at least one opening 14 that extends through a thickness of the semiconductor substrate 8, as illustrated in FIGS. 3-7. The opening 14 may be formed by laser drilling or ablation, dry etching, such as a reactive ion etch, photochemical etching, masking and anisotropic etching, mechanical drilling, or any other known process of forming openings in semiconductor substrates 8. For the sake of example only, the opening 14 may be formed by depositing a photoresist layer 16 over the bond pads 6 and the passivation layer 12. The photoresist layer 16 may be etched to expose at least a portion of the bond pad 6, as shown in FIG. 4. The photoresist layer 16 may be a conventional photoresist and is deposited by conventional techniques. The exposed portion of the bond pad 6 may be removed to expose at least a portion of the first oxide layer 10. The exposed portion of the first oxide layer 10 may be removed as shown in FIG. 5 to expose a portion of the semiconductor substrate 8, which is subsequently removed to form the opening 14, as shown in FIG. 6. Remaining portions of the photoresist layer 16 may then be removed as shown in FIG. 7. Alternatively, the exposed portion of the first oxide layer 10 and an underlying portion of the semiconductor substrate 8 may be etched substantially simultaneously to form the opening 14. The resulting opening 14 may have a high aspect ratio ranging from approximately 4:1 (substrate thickness:via diameter) to approximately 30:1.

Alternatively, the opening 14 may be formed by etching a hole through the bond pad 6 using a wet etch chemistry, as known in the art. The hole may be extended using a dry oxide etch, such as by reactive ion etching ("RIE"), to etch the first oxide layer 10 and expose the semiconductor substrate 8. A dimple may be formed in the semiconductor substrate 8 with a wet etch chemistry that includes a solution of tetramethylammonium hydroxide ("TMAH") and an organic solvent, such as propylene glycol. The dimple may range in size from approximately 10 µm to approximately 15 µm. The etch solution may include from approximately 1% by weight to approximately 10% by weight of TMAH and from approximately 90% by weight to approximately 99% by weight of the organic solvent. In one embodiment, the etch solution includes approximately 6% TMAH and approximately 94% propylene glycol.

The hole may be extended through the semiconductor substrate 8 by laser ablating a portion of the semiconductor substrate 8. The semiconductor substrate 8 may be laser ablated by directing a laser beam toward the dimple from a back surface of the semiconductor substrate 8. The dimple may keep energy produced by the laser beam from an active surface of the integrated circuit. The energy from the laser beam may ablate the portion of the semiconductor substrate 8, extending the hole and forming the opening 14. However, the energy from the laser beam may unduly heat the semiconductor substrate 8 surrounding the opening 14 and produce a heat affected zone ("HAZ"), which is an area of damaged silicon surrounding the opening 14. The material of the HAZ is commonly referred to as a "slag" and may include silicon and oxygen. The dimple formed in the semiconductor substrate 8 may also prevent slag from being deposited on the active surface of the integrated circuit. The HAZ may be removed so that the opening 14 has a sufficient width or diameter to form the necessary conductive path. The HAZ may be removed using the TMAH and propylene glycol etch solution previously described. This etch solution may selectively remove the HAZ without damaging other portions of the integrated circuit, such as the bond pad 6 or the first oxide layer 10.

The photoresist layer 16, the exposed portions of the bond pads 6, the exposed portions of the first oxide layer 10, and the exposed portions of the semiconductor substrate 8 may be removed from the intermediate semiconductor device structure 2 by using conventional dry etch chemistries, conventional wet etch chemistries, or a laser etch. The etching techniques and conditions may be selected by one of ordinary skill in the art based on the materials used in each of these layers. Therefore, the etching techniques and conditions are not discussed in detail herein. For sake of example only, the first oxide layer 10 may be etched using a plasma etch with a tetrafluoromethane ("$CF_4$") chemistry or a trifluoromethane ("$CHF_3$") and oxygen ("$O_2$") chemistry. Alternatively, the first oxide layer 10 may be etched with an aqueous solution of dilute hydrogen fluoride ("HF"). The semiconductor substrate 8 may be etched using a plasma etch with a $NF_3$, HBr/Cl, $C_2F_4$, or $SF_6$ chemistry.

The opening 14 may be lined with a second oxide layer 18 to seal portions of the semiconductor substrate 8 that are exposed when the opening 14 is formed. The second oxide layer 18 may be formed from a low stress or low Si oxide ("LSO"), which is deposited on the semiconductor substrate 8 by conventional techniques. The second oxide layer 18 may be deposited at a thickness ranging from 0.1 μm to approximately 5 μm, such as from approximately 1 μm to approximately 2 μm. A tungsten layer 20 may be formed over the second oxide layer 18 to provide a seed layer upon which the nickel is subsequently deposited. The tungsten layer 20 may have a thickness ranging from approximately 0.02 μm to approximately 1 μm. The tungsten layer 20 may be formed by atomic layer deposition ("ALD"), electroless deposition, electroplating, chemical vapor deposition ("CVD"), plasma-enhanced CVD ("PECVD"), or physical vapor deposition ("PVD"), as known in the art. An adhesion layer may optionally be present between the tungsten layer 20 and the second oxide layer 18 to more firmly adhere the tungsten layer 20 to the second oxide layer 18. The adhesion layer may be formed by ALD, CVD, PECVD, PVD, vacuum evaporation, or sputtering. In one embodiment, the adhesion layer is formed from titanium nitride ("TiN"). The adhesion layer may have a thickness ranging from approximately 50 Å to approximately 200 Å. The adhesion layer may be used in the opening 14 depending on a thickness of the tungsten layer 20. If the tungsten layer 20 is less than approximately 500 Å thick, the adhesion layer may not be needed to adhere the tungsten layer 20 to the second oxide layer 18. However, if the tungsten layer 20 is greater than approximately 500 Å thick, the adhesion layer may be used to adequately adhere the tungsten layer 20 to the second oxide layer 18.

If the via 4 is to be a BWI, the via 4 may be formed in the intermediate semiconductor device structure 2 by forming at least one opening 14 that extends a selected depth into the semiconductor substrate 8, as shown in FIG. 2. In this situation, the opening 14 may be formed as described above, except that the opening 14 does not extend through the entire thickness of the semiconductor substrate 8. The opening 14 may be lined with the second oxide layer 18 and the tungsten layer 20, as described above.

Figure 8:
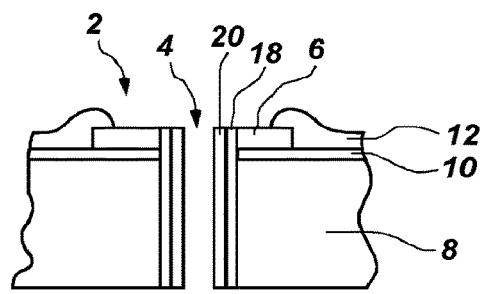
Figure 9:
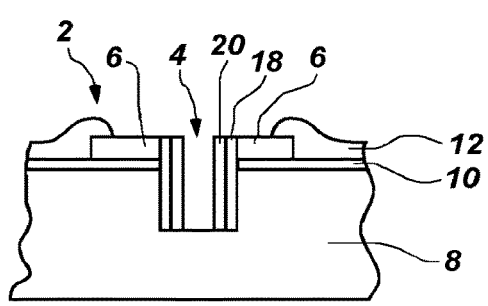

As shown in FIGS. 8 and 9, the second oxide layer 18, the tungsten layer 20, and the adhesion layer (if present) of the intermediate semiconductor device structure 2 may be etched to remove portions of these layers overlying the bond pads 6 and the passivation layer 12. Portions of the second oxide layer 18 and the tungsten layer 20 may remain in the via 4. This etch step is referred to herein as a "spacer etch." The etching techniques and conditions used to remove the second oxide layer 18, the tungsten layer 20, and the adhesion layer (if present) may be selected by one of ordinary skill in the art based on the materials in these layers and, therefore, are not discussed in detail herein. For sake of example only, the tungsten layer 20 and the adhesion layer (if present) may be removed with a conventional dry etch. The second oxide layer 18 may be removed with a conventional wet etch.

Figure 10:
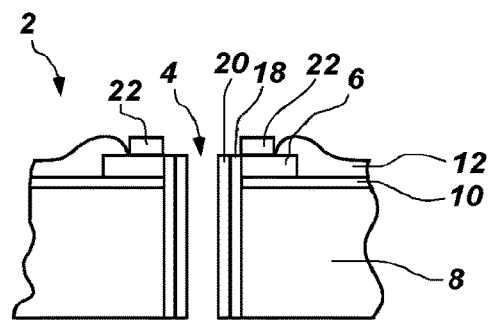
Figure 11:
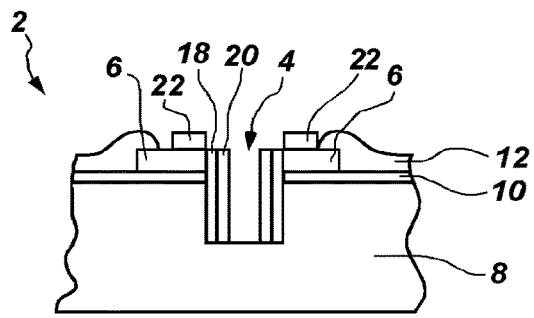

A first nickel layer 22 may then be plated on the exposed bond pads 6 without plating nickel on the tungsten layer 20, as shown in FIGS. 10 and 11. To form the first nickel layer 22, the surface of the bond pads 6 may be cleaned to remove aluminum oxides. By way of example, a cleaning solution used to remove the aluminum oxides may be an aqueous solution of sodium hydroxide ("NaOH") and nitric acid ("$HNO_3$") or phosphoric acid. The NaOH may dissolve the aluminum oxides on the surface of the bond pads 6 while the $HNO_3$ or phosphoric acid may etch the surface of the bond pads 6 to provide a clean aluminum surface upon which the first nickel layer 22 is ultimately plated. The cleaning solution may include from approximately 1% to approximately 5% NaOH and approximately 50% $HNO_3$, with the remainder being water. The bond pads 6 may be cleaned by immersing the intermediate semiconductor device structure 2 in the cleaning solution or by spraying the intermediate semiconductor device structure 2 with the cleaning solution. The bond pads 6 may then be rinsed with deionized water to remove the NaOH and $HNO_3$ or phosphoric acid. Other wet etches known in the art to remove the aluminum oxide formed on the bond pads 6 may also be employed.

After removing the aluminum oxides, the surface of the bond pads 6 may be activated toward nickel plating using an activator that is selective for aluminum. Since the aluminum activator is selective for aluminum, the surface of the tungsten layer 20 may not be activated toward nickel plating. The aluminum activator may be an aqueous zincate solution that includes a zinc source material, such as zinc oxide ("ZnO"), and a caustic base, such as NaOH or another alkali metal hydroxide. At alkaline pH, the zinc source material may be present in the zincate solution as $Zn(OH)_4$. The intermediate semiconductor device structure 2 may be exposed to the zincate solution for an amount of time sufficient to deposit a zinc-containing layer on the surface of the bond pads 6. The zinc-containing layer may include from approximately one monolayer to approximately two monolayers of a layer rich in zinc. The zinc-containing layer may function as a seed layer to the first nickel layer 22. The intermediate semiconductor device structure 2 may be exposed to the zincate solution for from approximately 10 seconds to approximately 1 minute. Zincate solutions are commercially available from various manufacturers, such as from LeaRonal Inc. (Buffalo, N.Y.) or PacTech GmbH (Berlin, Germany). The bond pads 6 of the intermediate semiconductor device structure 2 may be activated by immersing the intermediate semiconductor device structure 2 in the aluminum activator or spraying the intermediate semiconductor device structure 2 with the aluminum activator. The aluminum activator may be maintained at a temperature ranging from approximately 20° C. to approximately 40° C.

Once the bond pads 6 are activated toward nickel plating, the intermediate semiconductor device structure 2 may be rinsed with deionized water and immersed in a bath containing the electroless nickel plating solution to form the first nickel layer 22. The first nickel layer 22 may act as a wetting layer that enables molten solder to more effectively fill the via 4. The first nickel layer 22 may also act as a barrier layer. Electroless nickel plating solutions are known in the art, such as electroless nickel-phosphorus plating solutions or electroless nickel-boron plating solutions. Such electroless nickel plating solutions are commercially available, such as NicPac 2.1, NicPac 2.2, and NicPac 2.3, which are available from PacTech GmbH (Berlin, Germany) and RONAMAX® SMT, DURAPOSIT®, NIPOSIT®, NIPLATE™, which are available from Rohm and Haas Electronic Materials (Philadelphia, Pa.). These electroless nickel plating solutions include nickel salts, such as nickel sulfate, nickel chloride, nickel sulfate, nickel bromide, nickel fluoroborate, nickel sulfonate, nickel sulfamate, and nickel alkyl sulfonates, as a source of the nickel ion. The electroless nickel plating solution may also include a reducing agent, such as a phosphorus compound or a boron compound. Examples of reducing agents include sodium hypophosphite, dimethylamine borane, sodium borohydride, and DMAB. The electroless nickel plating solution may also include NaOH to maintain the pH of the solution and complexing agents, such as citric acid, lactic acid, or malic acid. The pH of the electroless nickel plating solution may be maintained from approximately 4 to approximately 6. During the electroless plating, nickel ions are reduced to nickel by oxidation of the reducing agent. In one embodiment, the electroless nickel plating solution includes nickel chloride, sodium hydroxyacetate, and sodium hypophosphite. In another embodiment, the electroless nickel plating solution includes nickel sulfate and sodium hypophosphite. The electroless nickel plating solution in the bath may be maintained at a temperature ranging from approximately 60° C. to approximately 100° C., such as from approximately 80° C. to approximately 90° C.

A thickness of the first nickel layer 22 on the bond pads 6 may depend on the concentration of nickel in the electroless nickel plating solution and an amount of time the intermediate semiconductor device structure 2 is immersed in the electroless nickel plating solution. The first nickel layer 22 may have a thickness ranging from approximately 500 Å to approximately 10 μm. In one embodiment, the first nickel layer 22 has a thickness of approximately 1 μm. The intermediate semiconductor device structure 2 may be immersed in the electroless nickel plating solution for an amount of time sufficient to deposit the desired thickness of the first nickel layer 22 on the bond pad 6, such as from approximately 1 minute to approximately 5 minutes. During the nickel plating, the zinc-containing layer on the bond pad 6 may be replaced with the first nickel layer 22. Since the nickel plating chemistry is selective for aluminum, the bond pad 6 may be substantially plated with nickel, while substantially no nickel is plated on the tungsten layer 20 in the via 4.

Since the nickel plating chemistry may be used to plate directly on copper, bond pads 6 formed from copper may be selectively plated with nickel without nickel plating the tungsten layer 20. Activation of the bond pads 6 formed from copper may occur substantially as described above in regard to the aluminum bond pad 6. Alternatively, the copper bond pad 6 may be activated with a palladium solution before nickel plating, rather than with the zincate solution.

Figure 12:
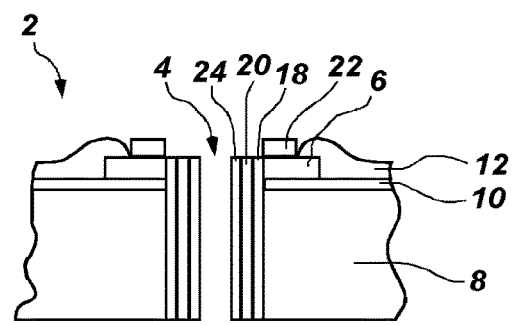
Figure 13:
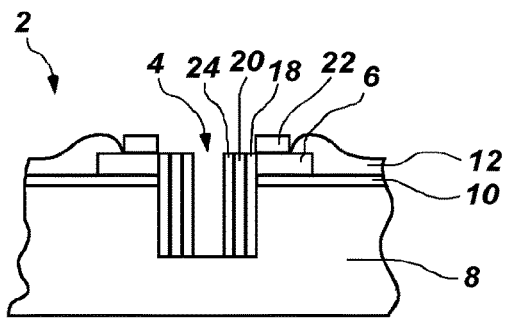

After the first nickel layer 22 has been formed over the bond pads 6, the second nickel layer 24 may be deposited in the opening 14 to line the via 4, as shown in FIGS. 12 and 13. The second nickel layer 24 may act as a wetting layer to enable the molten solder to more effectively fill the via 4. The second nickel layer 24 may be deposited over the tungsten layer 20 after first removing oxides from the tungsten layer 20. The tungsten layer 20 may be cleaned chemically, such as by using an aqueous potassium hydroxide ("KOH") solution.

The tungsten layer 20 may then be activated toward nickel plating with an activator that is selective for tungsten. Since the tungsten activator is selective for tungsten, the bond pads 6 may not be activated toward nickel plating. The tungsten activator may be an aqueous palladium solution that includes palladium (II) ions. The intermediate semiconductor device structure 2 may be exposed to the tungsten activator for a sufficient amount of time to deposit a thin layer of palladium on the surface of the tungsten layer 20. For instance, the intermediate semiconductor device structure may be exposed to the tungsten activator for from approximately 10 seconds to approximately 1 minute. The tungsten layer 20 of the intermediate semiconductor device structure 2 may be activated by immersing the intermediate semiconductor device structure 2 in the tungsten activator or spraying the intermediate semiconductor device structure 2 with the tungsten activator.

After the tungsten layer 20 is activated toward nickel plating, the intermediate semiconductor device structure 2 may be immersed in a bath containing the electroless nickel plating solution to form the second nickel layer 24 on the tungsten layer 20. The electroless nickel plating solution may be a conventional nickel plating solution. The electroless nickel plating solution may be the same electroless nickel plating solution as used to plate the first nickel layer 22 or may be a different electroless nickel plating solution. The electroless nickel plating solutions are as previously described. The second nickel layer 24 may have a thickness ranging from approximately 500 Å to approximately 10 μm. In one embodiment, the second nickel layer 24 has a thickness ranging from approximately 3 μm to approximately 5 μm. The intermediate semiconductor device structure 2 may be immersed in the electroless nickel plating solution for an amount of time sufficient to deposit the desired thickness of the second nickel layer 24 on the bond pad 6, such as from approximately 1 minute to approximately 5 minutes. During the nickel plating, the layer of palladium on the tungsten layer 20 may be replaced with the second nickel layer 24. Since the electroless nickel plating solution is selective for tungsten, the tungsten layer 20 may be substantially plated with nickel while substantially no nickel is plated on the bond pads 6.

Figure 14:
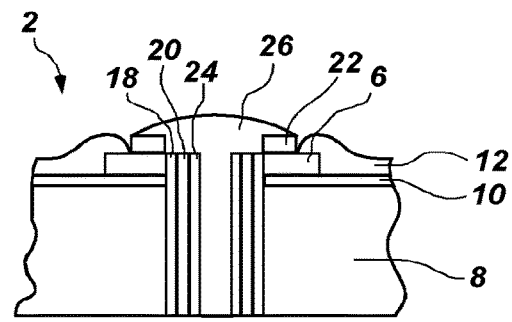
Figure 15:
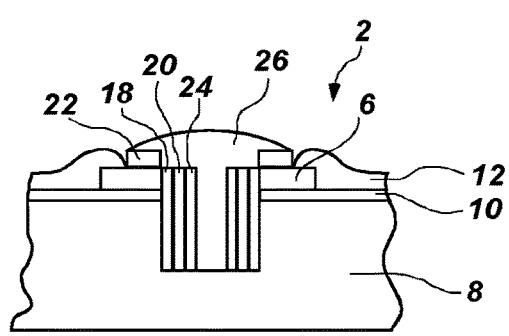

The via 4 may then be filled with solder 26 to provide the conductive pathway, as shown in FIGS. 14 and 15. The solder may be a conventional solder formulation that includes tin, lead, indium, antimony, silver, copper, and mixtures thereof. The solder may be capable of wetting or filling the via 4. Suitable solder formulations may include, but are not limited to 95% lead/5% tin, 60% lead/40% tin, 63% indium/37% tin, 100% tin, and 62% lead/36% tin/2% silver. To fill the via 4 with the solder 26, the solder 26 may be heated to a temperature sufficient to melt the solder 26, such as from 180° C. to approximately 300° C. The molten solder may then be deposited in the via 4 or near the bond pads 6. If the molten solder is deposited near the bond pads 6, it may be reflowed into the via 4 to provide the conductive path. The solder 26 may also be deposited using a wave solder process in which the molten solder is applied to a back surface of the intermediate semiconductor device structure 2, if the via 4 is a TWI. The molten solder may then be drawn into the via 4 by capillary action and wetting forces.

Figure 16:
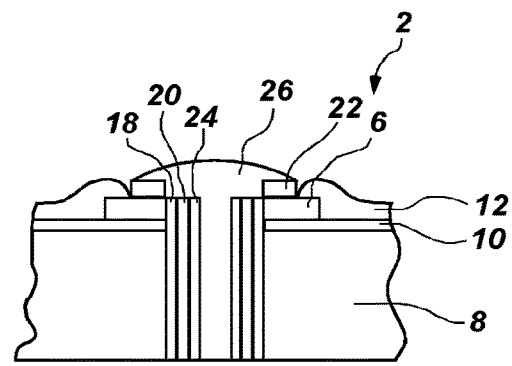

If the via 4 is a BWI, a mass of solder, such as a solder ball, may be placed at the mouth of the via 4, melted, and drawn into the via 4 by capillary action. A back surface of the semiconductor substrate 8 may be removed, as shown in FIG. 16, to expose the via 4. The back surface of the semiconductor substrate 8 may be removed by backgrinding, as known in the art. Backgrinding of the semiconductor substrate 8 may be achieved by chemical mechanical polishing ("CMP") or by abrasive means. After removing the back surface, the via 4 may extend through the thickness of the semiconductor substrate 8, forming a TWI. As such, the TWI may be formed directly or may be formed after first forming the BWI.

Figure 17:
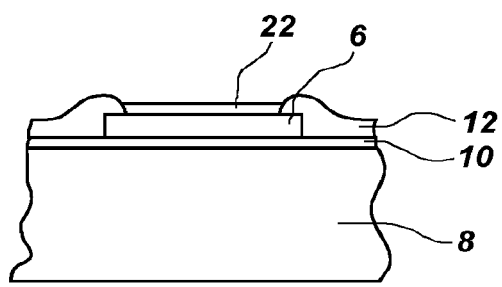
FIGS. 17-20 schematically illustrate a cross sectional view of another embodiment of an integrated circuit in which a through-wafer-interconnect is formed.
Figure 18:
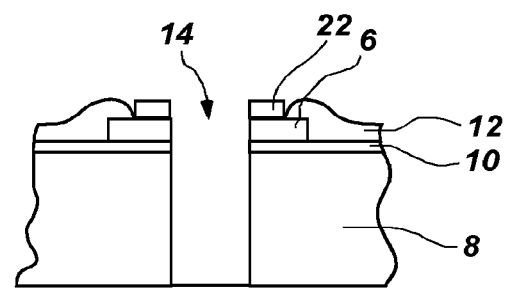
Figure 19:
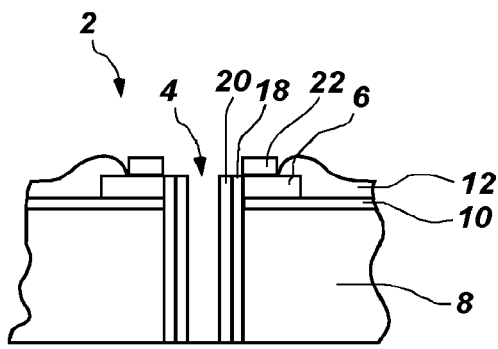
Figure 20:
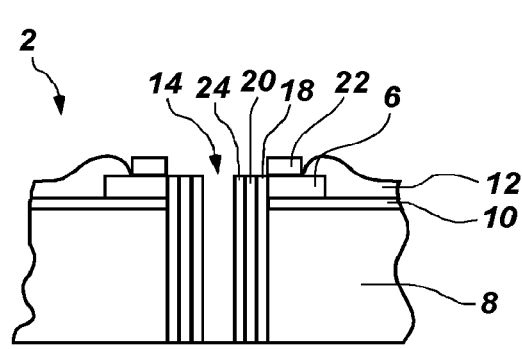

Alternatively, the first nickel layer 22 may be formed over the bond pads 6, as shown in FIG. 17. The first nickel layer 22 may be formed as previously described. Then, the opening 14 may be formed in the semiconductor substrate 8, as shown in FIG. 18. The opening 14 may be formed as previously described. The second oxide layer 18, the tungsten layer 20, and, optionally, the adhesion layer, may then be deposited in the opening 14 to form the via 4. As shown in FIG. 19, the second oxide layer 18, the tungsten layer 20, and the adhesion layer (if present) may be removed from the surface of the intermediate semiconductor device structure 2 using the spacer etch. The second nickel layer 24 may then be plated over the tungsten layer 20, as shown in FIG. 20. The second nickel layer 24 may be plated as previously described. The via 4 may then be filled with solder 26, as previously described in regard to FIG. 14. By depositing the first nickel layer 22 over the bond pads 6 before the via 4 is formed, nickel may not be deposited on portions of the semiconductor substrate 8 that are exposed after the opening 14 is formed.

By depositing the first nickel layer 22 on the aluminum structure before depositing the second nickel layer 24 on the tungsten structure, the aluminum structure may be protected during subsequent processing steps. For instance, the first nickel layer 22 may act as a nickel mask to protect the aluminum structure from exposure to the tungsten activator. The tungsten structure may then be nickel plated without further protecting the aluminum structure. In addition, since the tungsten structure is nickel plated after nickel plating the aluminum structure, nickel is not removed from the tungsten structure by the cleaning, activating, and plating chemistries used to plate the aluminum structure. In other words, the etching chemistry used to remove the aluminum oxides may not remove portions of the second nickel layer 24 from inside the via 4.

As previously mentioned, in another embodiment, the tungsten structure is plated with nickel before nickel plating the aluminum structure. The tungsten structure may be selectively plated with nickel by activating the tungsten structure toward nickel plating and subsequently depositing the nickel, as previously described. The aluminum structure may then be nickel plated by activating the aluminum structure toward nickel plating and subsequently depositing the nickel, as previously described.

In another embodiment, the tungsten structure and the aluminum structure are plated with nickel substantially simultaneously by activating the surfaces of both the tungsten structure and the aluminum structure before nickel plating. The aluminum structure may be activated by exposing the intermediate semiconductor device structure 2 to the zincate solution, as previously described. The intermediate semiconductor device structure 2 may then be exposed to the tungsten activator to activate the tungsten structure. The activated tungsten structure and the aluminum structure may then be nickel plated, as previously described.

In addition to selectively plating one of the aluminum structure and the tungsten structure with nickel, the method of the present invention may also be used to selectively plate one of a copper structure and the tungsten structure with nickel. As such, the bond pad 6 may be formed from copper or mixtures of aluminum and copper. Since conventional nickel plating chemistries may be plated directly onto copper, the bond pad 6 formed from copper may be selectively plated with nickel.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A semiconductor device, comprising:
   an interconnect comprising a nickel material surrounding a copper-containing material; and
   a metal interconnection structure surrounding an end of the interconnect, the metal interconnection structure electrically coupled to the interconnect by another nickel material.

2. The semiconductor device of claim 1, wherein the metal interconnection structure comprises an annular ring, a bond pad, a component lead, a metal wire, or other metal layer.

3. The semiconductor device of claim 1, wherein the copper-containing material comprises a conductive pathway comprising copper.

4. The semiconductor device of claim 1, wherein the interconnect further comprises a seed material surrounding the nickel material.

5. The semiconductor device of claim 1, wherein the metal interconnection structure comprises copper, aluminum, or combinations thereof.

6. The semiconductor device of claim 1, wherein the metal interconnection structure comprises a thickness of from approximately 1.0 µm to approximately 1.5 µm.

7. The semiconductor device of claim 1, further comprising a passivation material comprising at least one of silicon oxide and silicon nitride adjacent to the metal interconnection structure.

8. The semiconductor device of claim 7, wherein the passivation material comprises a thickness of from approximately 0.5 µm to 10 µm.

9. The semiconductor device of claim 1, wherein the nickel material comprises a thickness of from approximately 3 µm to approximately 5 µm.

10. The semiconductor device of claim 1, wherein the another nickel material comprises a thickness of from approximately 500 Å to approximately 10 µm.

11. A semiconductor device, comprising:
    an interconnect at least partially extending through a material, the interconnect comprising a nickel material surrounding a copper core;
    a copper bond pad around an end of the interconnect; and another nickel material over the copper bond pad and electrically coupled to the interconnect.

12. The semiconductor device of claim 11, wherein the interconnect comprises a through-water-interconnect.

13. The semiconductor device of claim 11, wherein the interconnect comprises a blind-wafer-interconnect.

14. The semiconductor device of claim 11, wherein the interconnect further comprises one or more of silver, tin, lead, indium, and antimony.

15. The semiconductor device of claim 11, wherein the interconnect further comprises a tungsten material around the nickel material.

16. The semiconductor device of claim 15, wherein the tungsten material comprises a thickness of from approximately 0.02 µm to approximately 1 µm.

17. The semiconductor device of claim 15, further comprising a titanium nitride material adjacent to the tungsten material.

18. A semiconductor device, comprising:
  an interconnect extending through a material, the interconnect comprising a nickel material surrounding a copper core;
  a copper bond pad around an end of the interconnect; and
  another nickel material adjacent the copper bond pad and electrically coupled to the interconnect.

19. The semiconductor device of claim 18, wherein the copper core comprises a conductive pathway comprising copper.

20. The semiconductor device of claim 18, wherein the copper core further comprises one or more of silver, tin, lead, indium, and antimony.

* * * * *